(12) United States Patent
Lee

(10) Patent No.: US 12,396,327 B2
(45) Date of Patent: Aug. 19, 2025

(54) ARRAY SUBSTRATE STRUCTURE

(71) Applicant: InnoLux Corporation, Miao-Li County (TW)

(72) Inventor: Kuan-Feng Lee, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 18/756,149

(22) Filed: Jun. 27, 2024

(65) Prior Publication Data
US 2024/0349537 A1 Oct. 17, 2024

Related U.S. Application Data

(63) Continuation of application No. 18/188,009, filed on Mar. 22, 2023, now Pat. No. 12,052,894, which is a continuation of application No. 17/249,801, filed on Mar. 15, 2021, now Pat. No. 11,631,728, which is a continuation of application No. 16/679,702, filed on Nov. 11, 2019, now Pat. No. 10,978,533, which is a
(Continued)

(30) Foreign Application Priority Data

Jul. 5, 2016 (TW) .................... 105121191

(51) Int. Cl.
| | |
|---|---|
| H10K 59/121 | (2023.01) |
| H10D 30/67 | (2025.01) |
| H10D 86/40 | (2025.01) |
| H10D 86/60 | (2025.01) |
| H10K 59/131 | (2023.01) |
| H10K 59/40 | (2023.01) |

(52) U.S. Cl.
CPC ....... *H10K 59/1213* (2023.02); *H10D 86/411* (2025.01); *H10D 86/423* (2025.01); *H10D 86/441* (2025.01); *H10D 86/471* (2025.01); *H10D 86/60* (2025.01); *H10K 59/131* (2023.02); *H01L 2224/16225* (2013.01); *H10D 30/6731* (2025.01); *H10D 30/6745* (2025.01); *H10D 30/6755* (2025.01); *H10D 86/481* (2025.01); *H10K 59/40* (2023.02)

(58) Field of Classification Search
CPC .. H10K 59/1213; H10K 59/131; H10K 59/40; H10D 86/411; H10D 86/423; H10D 86/441; H10D 86/471; H10D 86/60; H10D 30/6731; H10D 30/6745; H10D 30/6755; H10D 86/481; H01L 2224/16225; H01L 27/3262; H01L 27/1218; H01L 27/1225; H01L 27/1251; H01L 27/3276; H01L 27/1255; H01L 27/323; H01L 29/78675; H01L 29/7869
See application file for complete search history.

(56) References Cited

U.S. PATENT DOCUMENTS

| | | | |
|---|---|---|---|
| 8,643,015 B2* | 2/2014 | Yamazaki | H01L 27/124 257/66 |
| 2013/0334533 A1* | 12/2013 | Yamazaki | H01L 29/7832 257/66 |
| 2015/0263008 A1* | 9/2015 | Atsumi | G11C 7/1006 257/300 |

* cited by examiner

*Primary Examiner* — Jonathan Han
(74) *Attorney, Agent, or Firm* — McClure, Qualey & Rodack, LLP

(57) ABSTRACT

An array substrate structure is provided, which includes a substrate with a first surface and a second surface opposite to the first surface. A first TFT is on the first surface of the substrate, and a second TFT is on the second surface of the substrate. A through via passes through the substrate, and the first TFT is electrically connected to the second TFT through the through via.

4 Claims, 13 Drawing Sheets

Related U.S. Application Data continuation of application No. 15/629,912, filed on Jun. 22, 2017, now Pat. No. 10,504,982.

ARRAY SUBSTRATE STRUCTURE

CROSS REFERENCE TO RELATED APPLICATIONS

This application is a Continuation of U.S. patent application Ser. No. 18/188,009, filed on Mar. 22, 2023 and entitled "Array substrate structure", which is a Continuation of U.S. patent application Ser. No. 17/249,801, filed on Mar. 15, 2021 and entitled "Array substrate structure and display device" (now U.S. Pat. No. 11,631,728, issued on Apr. 18, 2023), which is a Continuation of U.S. patent application Ser. No. 16/679,702, filed on Nov. 11, 2019 and entitled "Array substrate structure and display device" (now U.S. Pat. No. 10,978,533, issued on Apr. 13, 2021), which is a Continuation of U.S. patent application Ser. No. 15/629,912, filed on Jun. 22, 2017 and entitled "Array substrate structure and display device" (now U.S. Pat. No. 10,504,982, issued on Dec. 10, 2019), which claims priority of Taiwan Patent Application No. 105121191, filed on Jul. 5, 2016 (now Taiwan Pat. No. TWI602306B, issued on Oct. 11, 2017), the entirety of which are incorporated by reference herein.

BACKGROUND

Technical Field

The disclosure relates to a display device, and in particular relates to a display with a plurality of transistors of different types.

Description of the Related Art

The thin film transistors (TFT) for driving pixels can be classified as either polysilicon transistors (e.g. LTPS transistors) or metal oxide transistors (e.g. IGZO transistors). The former has a high switch-on current (Ion) or high carrier mobility, and the latter has a low switch-off current or excellent uniformity. Each of the two types of transistor has its respective advantages, but no single type simultaneously has all advantages.

For simultaneously achieving the advantages of the two types of transistor, some IC design such as 2T1C or 4T2C utilizes at least two types of transistors for driving a single pixel. However, the fact that the transistor occupies a greater area, and the display region occupies a smaller area in the display field, which may reduce the image resolution of the display. In other words, the conventional IC design of several types of transistors will result in the problem of lower image resolution.

Accordingly, a novel structure for solving the problem (the low resolution caused from the overly large area occupied by the transistors).

BRIEF SUMMARY

One embodiment of the disclosure provides an array substrate structure, including a substrate; a first transistor disposed on the substrate, including a first semiconductor layer having a drain region; a second transistor disposed on the substrate, including a gate electrode and a second semiconductor layer corresponding to the gate electrode; and a driving voltage line electrically connected to the second semiconductor layer; wherein the drain region of the first semiconductor layer is electrically connected to the gate electrode of the second transistor; and wherein the first semiconductor layer and the second semiconductor layer include different materials.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is the contemplated mode of carrying out the disclosure. This description is made for the purpose of illustrating the general principles of the disclosure and should not be taken in a limiting sense. The scope of the disclosure is determined by reference to the appended claims.

Figure 1:
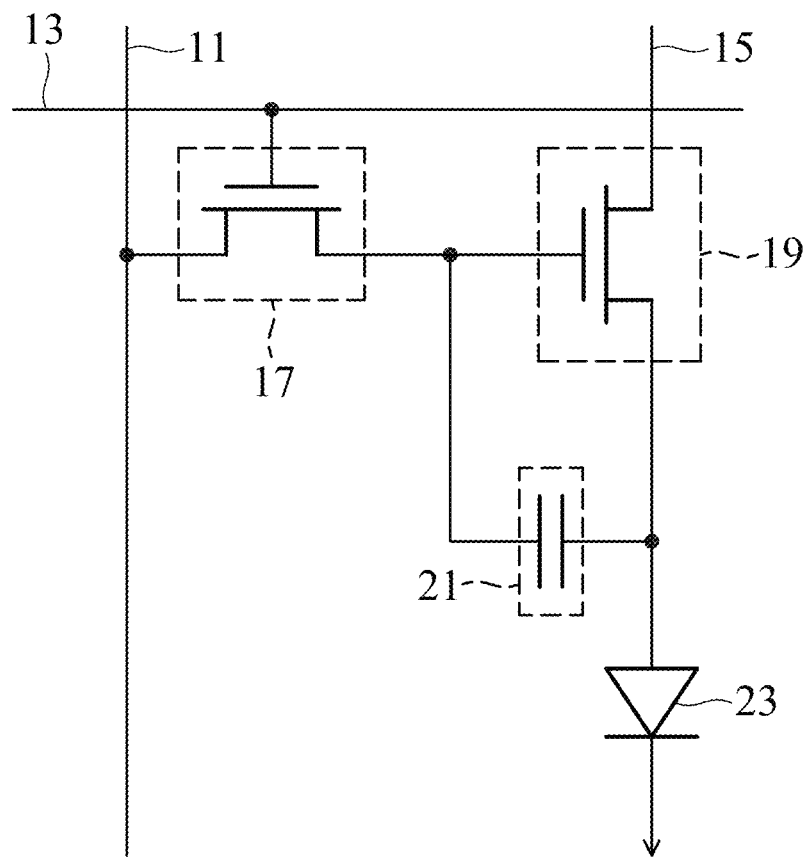
FIG. 1 shows a circuit diagram of a single light-emitting element driven by a plurality of transistors in one embodiment of the disclosure.

FIG. 1 shows a circuit diagram of a single light-emitting element driven by a plurality of transistors in one embodiment of the disclosure. Data lines 11 and scan lines 13 are vertically crossed to define pixels, and each of the pixels has a switching transistor 17 and a driving transistor 19 to drive a light-emitting element 23. In one embodiment, the switching transistor 17 is a polysilicon transistor (e.g. LTPS transistor), and the driving transistor 19 is a metal oxide transistor (e.g. IGZO transistor). Alternatively, the switching transistor 17 and the driving transistor 19 are the same. As shown in FIG. 1, the scan line 13 is connected to a gate electrode of the switching transistor 17, and the data line 11 is connected to a source electrode of the switching transistor 17. A drain electrode of the switching transistor 17 is connected to a gate electrode of the driving transistor 19, and a driving voltage line 15 is connected to a source electrode of the driving transistor 19. A drain electrode of the driving transistor 19 is connected to an electrode plate of a storage capacitor 21, and an electrode of the light-emitting element 23, and the drain electrode of the switching transistor 17 and the gate electrode of the driving transistor 19 are connected to another electrode plate of the storage capacitor 21. Another electrode of the light-emitting element 23 is a common electrode.

Figure 2:
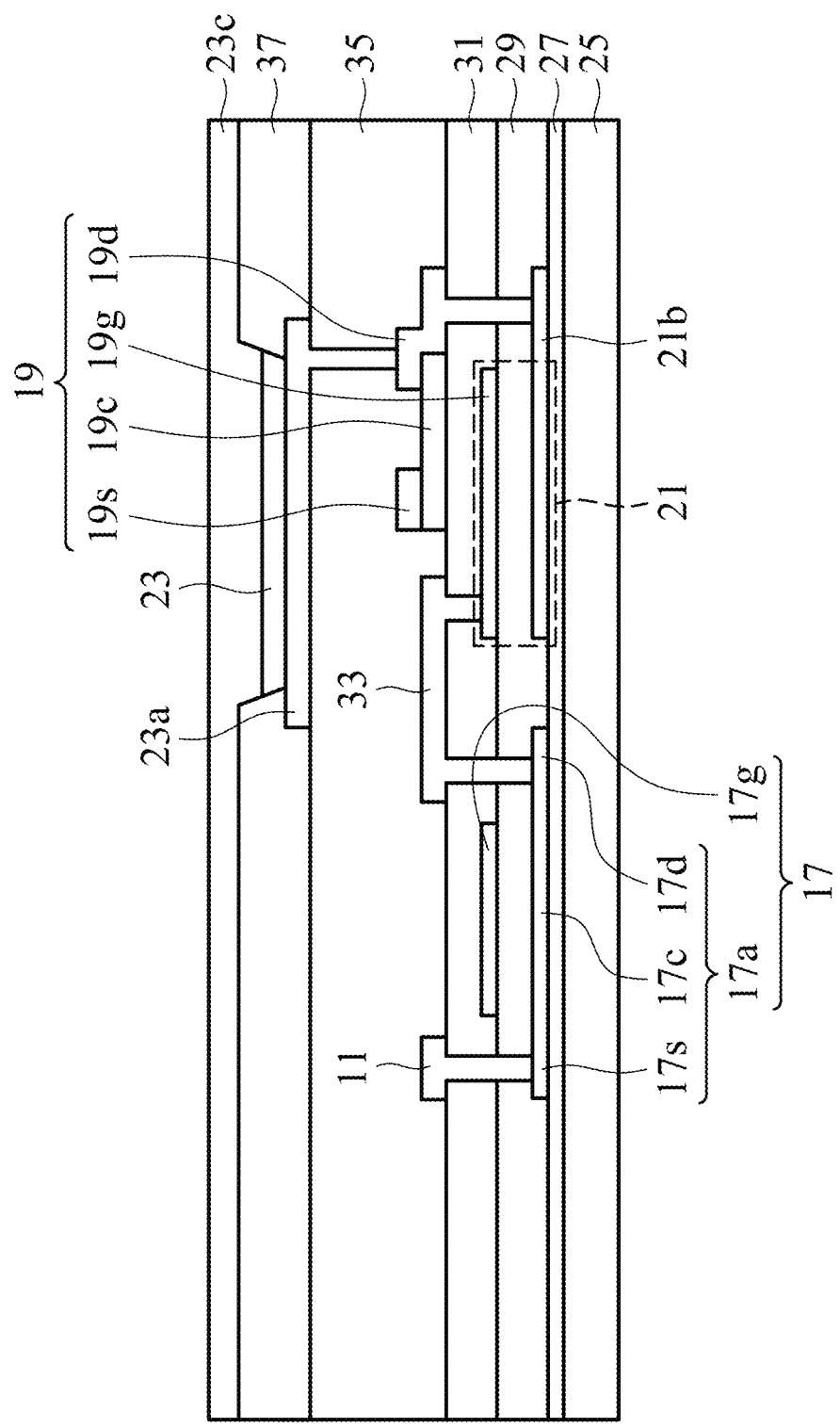
FIG. 2 shows a partial cross-sectional view of a display device corresponding to the circuit diagram of FIG. 1 in one embodiment of the disclosure.

FIG. 2 shows a partial cross-sectional view of a display device corresponding to the circuit diagram of FIG. 1 in one embodiment of the disclosure. As shown in FIG. 2, a buffer layer 27 is formed on a substrate 25. In one embodiment, the substrate 25 can be glass substrate, and the buffer layer 27 can be composed of silicon oxide, silicon nitride, or a multi-layered structure thereof. A semiconductor layer 17a is formed in a predetermined region for a switching transistor 17, and a semiconductor layer 21b is formed in a predetermined region for a driving transistor 19. In one embodiment, the semiconductor layers 17a and 21b can be composed of low temperature polysilicon (LTPS). The semiconductor layer 17a can be divided into a channel region 17c, and a source region 17s and a drain region 17d at two sides of the channel region 17c. A gate insulation layer 29 is then formed on the semiconductor layers 17a and 21b and the buffer layer 27. In one embodiment, the gate insulation layer 29 can be composed of silicon oxide. Subsequently, a gate electrode 17g is formed on the gate insulation layer 29 to correspond to the channel region 17c, and a gate electrode 19g is formed on the gate insulation layer 29 to correspond to the semiconductor layer 21b. In one embodiment, the gate electrodes 17g and 19g can be composed of metal, and a major structure of the switching transistor 17 is completed. A storage capacitor 21 is built of the semiconductor layer 21b, the gate electrode 19g, and the gate insulation layer 29, the gate insulation layer 29 is disposed between the semiconductor layer 21b and the gate electrode 19g.

A gate insulation layer 31 is then formed on the gate electrodes 17g and 19g and the gate insulation layer 29. In one embodiment, the gate insulation layer 31 can be composed of silicon oxide. A semiconductor layer 19c is then formed on the gate insulation layer 31 to correspond to the gate electrode 19g. In one embodiment, the semiconductor layer 19c can be composed of a metal oxide semiconductor such as indium gallium zinc oxide (IGZO). A plurality of through vias are defined by lithography and etching to penetrate through the gate insulation layers 29 and 31, and a conductor is then disposed in the through vias and layered on the gate insulation layer 31. The conductor layer can be then patterned by lithography and etching to define a data line 11, the data line 11 connected to the source region 17s through one of the through vias, a scan line (not shown) connected to the gate electrode 17g through one of the through vias, a bridging line 33 connected to the drain region 17d and the gate electrode 19g through two of the through vias, a source electrode 19s and a driving voltage line (not shown) connected to the source electrode 19s, and a drain electrode 19d connected to the semiconductor layer 21b. The source electrode 19s and the drain electrode 19d contact two respective sides of the semiconductor layer 19c. A major structure of the driving transistor 19 is completed. An insulation layer 35 is then formed on the conductive lines/structures and the gate insulation layer 31, and then patterned by lithography and etching to define a through via to penetrate through the insulation layer 35. The insulation layer 35 may be a single layer or multi-layers, and the insulation layer may comprise inorganic material, organic material, or combination thereof. A conductor is then disposed in the through vias and on the insulation layer 35. The conductor layer can be then patterned by lithography and etching to define an electrode 23a, connected to the drain electrode 19d through the through via. An insulation layer 37 is then formed on the electrode 23a, and then patterned by lithography and etching to form an opening for exposing a part of the electrode 23a. In one embodiment, the insulation layer 37 can be composed of organic insulation material. A light-emitting element 23 is then formed on the electrode 23a in the opening, and a common electrode 23c is then formed on the light-emitting element 23 and the insulation layer 37.

In FIG. 2, both the switching transistor 17 and the driving transistor 19 are disposed on the top surface (the same side) of the substrate 25, and the image resolution is reduced by the large transistor area.

Figure 3A:
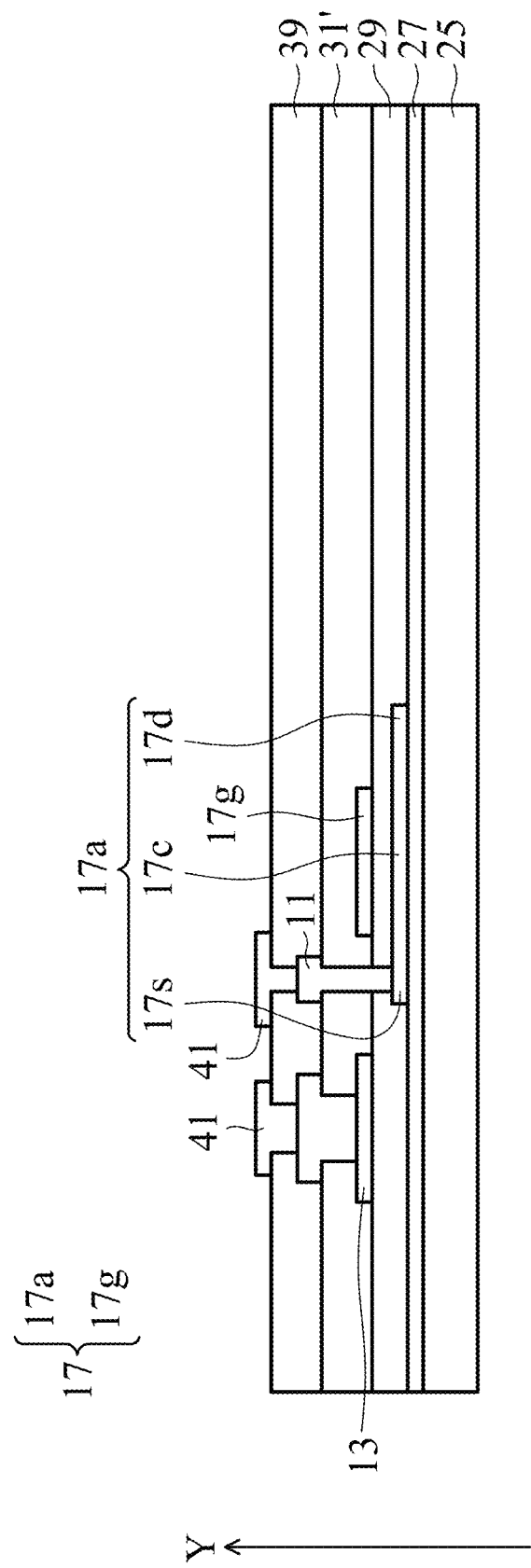
FIGS. 3A to 3E show partial cross-sectional views of a process for manufacturing a display device corresponding to the circuit diagram of FIG. 1 in one embodiment of the disclosure.

FIGS. 3A to 3E show partial cross-sectional views of a process for manufacturing a display device corresponding to the circuit diagram of FIG. 1 in one embodiment of the disclosure. In following embodiment, if an element is marked by a symbol or a numeral similar to that of a previous element, the element will be composed of the same material of the previous element and formed by the same process for forming the previous element without further description. The related description of the composition and the formation of the element will be omitted. As shown in FIG. 3A, a buffer layer 27 is formed on a substrate 25, and a semiconductor layer 17a is formed in a predetermined region for a switching transistor 17. In one embodiment, the semiconductor layer 17a can be composed of LTPS. The semiconductor layer 17a can be divided to a channel region 17c, and a source region 17s and a drain region 17d at two sides of the channel region 17c. A gate insulation layer 29 is then formed on the semiconductor layer 17a and the buffer layer 27. Subsequently, a scan line 13 and a gate electrode 17g is formed on the gate insulation layer 29, and the gate electrode 17g corresponds to the channel region 17c. In FIG. 3A, the gate electrode 17g contacts the scan line 13 through a through hole. A major structure of the switching transistor 17 is formed.

An insulation layer 31' is then formed on the gate electrode 17g, the scan line 13, and the gate insulation layer 29. In one embodiment, the insulation layer 31' may be composed of a material that is similar to that of the described gate insulation layer 31. A plurality of through vias are defined by lithography and etching to penetrate the gate insulation layer 29 and the insulation layer 31', and a conductor is then disposed in the through vias and layered on the insulation layer 31'. The conductor layer can be then patterned by lithography and etching to define a data line 11 connected to the source region 17s through one of the through vias, and a contact connected to the scan line 13 through one of the through vias. A protection layer 39 is then formed on the data line 11, the contact, and the insulation layer 31'. In one embodiment, the protection layer can be composed of organic, inorganic material, or a stacked material, the stacked material may be made of inorganic material (e.g. silicon oxide or silicon nitride) and organic material, and the inorganic materials disposed followed by the organic material. The protection layer 39 is then patterned by lithography and etching for forming through vias to penetrate through the protection layer 39, and a conductor is disposed in the through vias and layered on the protection layer 39. The conductor layer can be then patterned by lithography and etching to define contacts 41 contacting the data line 11 and the contact through the through vias.

Figure 3B:
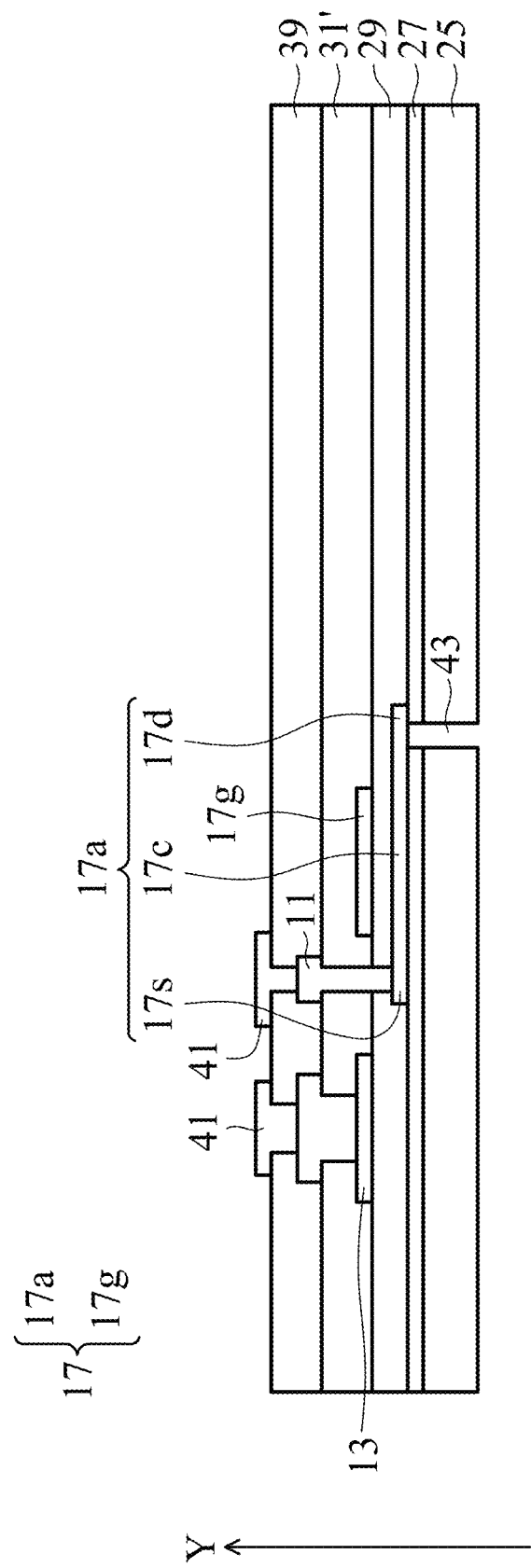

As shown in FIG. 3B, a through via 43 is formed to penetrate the buffer layer 27 and the substrate 25, thereby exposing a part of the drain region 17d. Alternatively, the through via 43 is formed to penetrate through the substrate 25 and the buffer layer, and the semiconductor layer 17a and the other layered structure thereon are then formed.

Figure 3C:
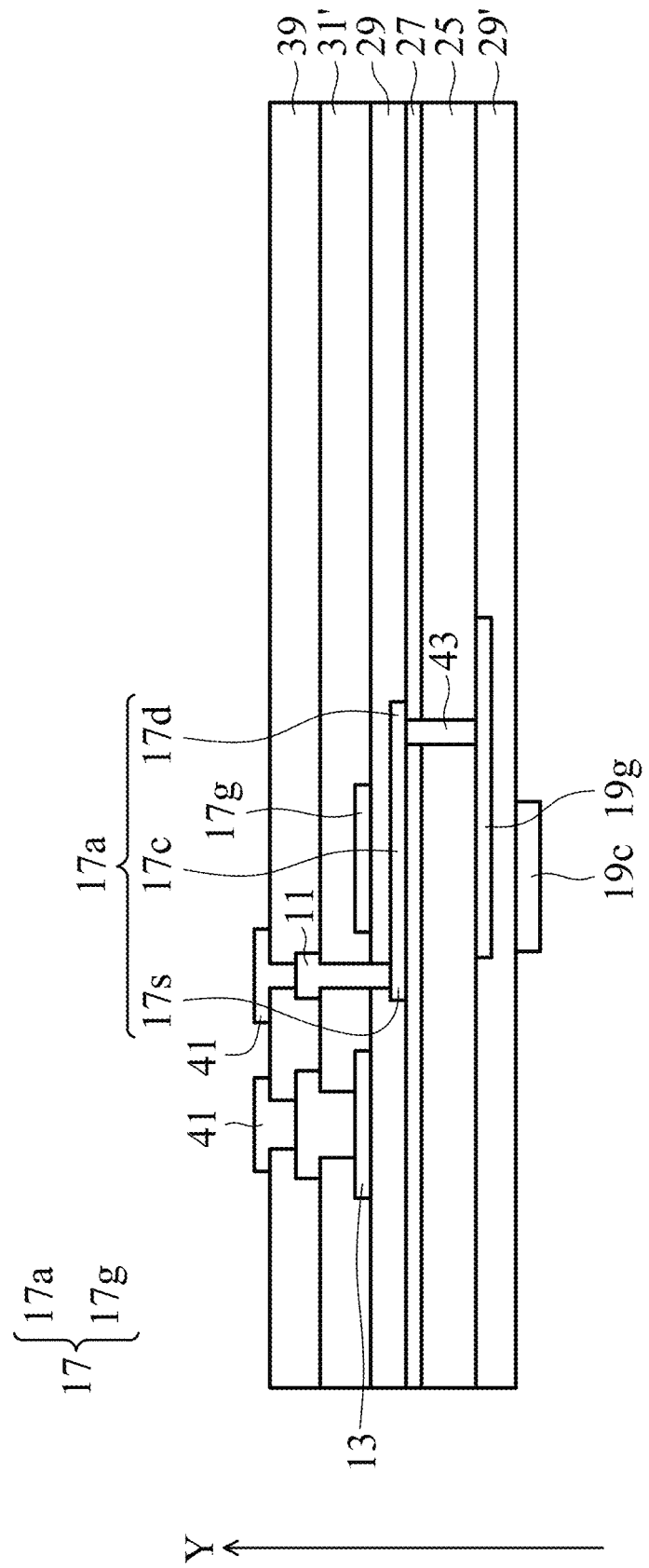

As shown in FIG. 3C, a conductor is disposed in the through via 43 and layered on the bottom surface of the substrate 25. The material of the conductor can comprise metal, but not limited thereto. The conductor can be then patterned by lithography and etching to define a gate electrode 19g connected to the drain region 17d of the switching transistor 17 through the through via 43. A gate insulation layer 29' is then formed on the gate electrode 19g and the substrate 25. In one embodiment, the gate insulation layer 29' can be composed of a material that is similar to that of the described gate insulation layer 29. A semiconductor layer 19c is formed on the gate insulation layer 29' to correspond to the gate electrode 19g.

Figure 3D:
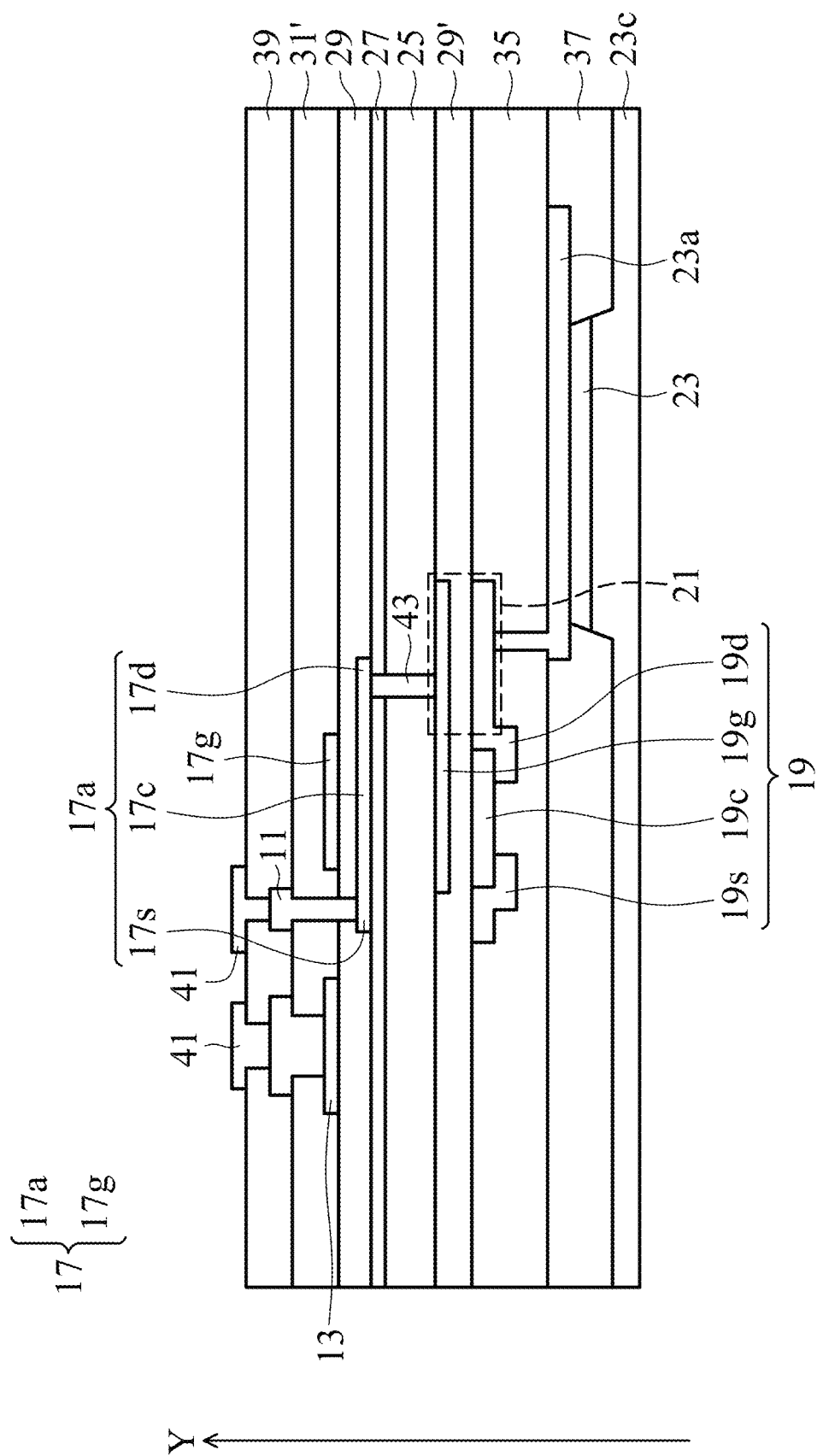

As shown in FIG. 3D, a source electrode 19s and a drain electrode 19d are formed on two respective sides of the semiconductor layer 19c, and a driving voltage line (not shown) is formed to connect to the source electrode 19s. Subsequently, an insulation layer 35 is formed on the gate insulation layer 29', the source electrode 19s, the drain electrode 19d, and the semiconductor layer 19c. The insulation layer 35 may be a single layer or multi-layers, and the insulation layer may comprise inorganic material, organic material, or combination thereof. A major structure of the driving transistor 19 is completed. A storage capacitor 21 is built of the gate electrode 19g, the drain electrode 19d, and the gate insulation layer 29', the gate insulation layer 29' is disposed between the gate electrode 19g and the drain electrode 19d. The insulation layer 35 is then patterned by lithography and etching to form a through via, the through via penetrates through the insulation layer 35, and a conductor is disposed in the through via and layered on the insulation layer 35. The conductor layer can be then patterned and connects to the drain electrode 19d through the through via to define an electrode 23a, An insulation layer 37 is then formed on the electrode 23a and the insulation layer 35, and then patterned by lithography and etching to form an opening for exposing a part of the electrode 23a. A light-emitting element 23 is then formed on the electrode 23a in the opening, and a common electrode 23c is then formed on the light-emitting element 23. In some embodiments, the light-emitting element 23 can be an organic light-emitting diode (OLED) or a light-emitting diode (LED).

In FIG. 3D, the switching transistor 17 and the driving transistor 19 are overlapped in a direction Y, that the direction Y is vertical to the surface of the substrate 25, and reducing the transistor area for enhancing the image resolution. In addition, the light-emitting element 23 is not overlapped with the transistors in the direction Y that is vertical to the surface of the substrate 25. Therefore, When the electrode 23a and the common electrode 23c are composed of a transparent conductive material (e.g. ITO), and the insulation layer 35, the gate insulation layer 29', the substrate 25, the buffer layer 27, the gate insulation layer 29, the insulation layer 31', and the protection layer 39 with suitable materials and thicknesses are transparent for the light. The light-emitting element 23 of the display device may simultaneously emit light in upward and downward directions. In this embodiment, the display device belongs to a two-sided lighting device. In another embodiment, the electrode 23a, the insulation layer 35, the gate insulation layer 29', the substrate 25, the buffer layer 27, the gate insulation layer 29, the insulation layer 31', and the protection layer 39 with suitable materials and thicknesses are transparent for the light, but the common electrode 23c may be an opaque or reflected conductive material (e.g. metal). The display device belongs to a one-sided (top-sided) lighting device. In a further embodiment, at least one of the electrode 23a, the insulation layer 35, the gate insulation layer 29', the substrate 25, the buffer layer 27, the gate insulation layer 29, the insulation layer 31', and the protection layer 39 is opaque, and the common electrode 23c is a transparent conductive material (e.g. ITO). The display device belongs to a one-sided (bottom-sided) lighting device.

Figure 3E:
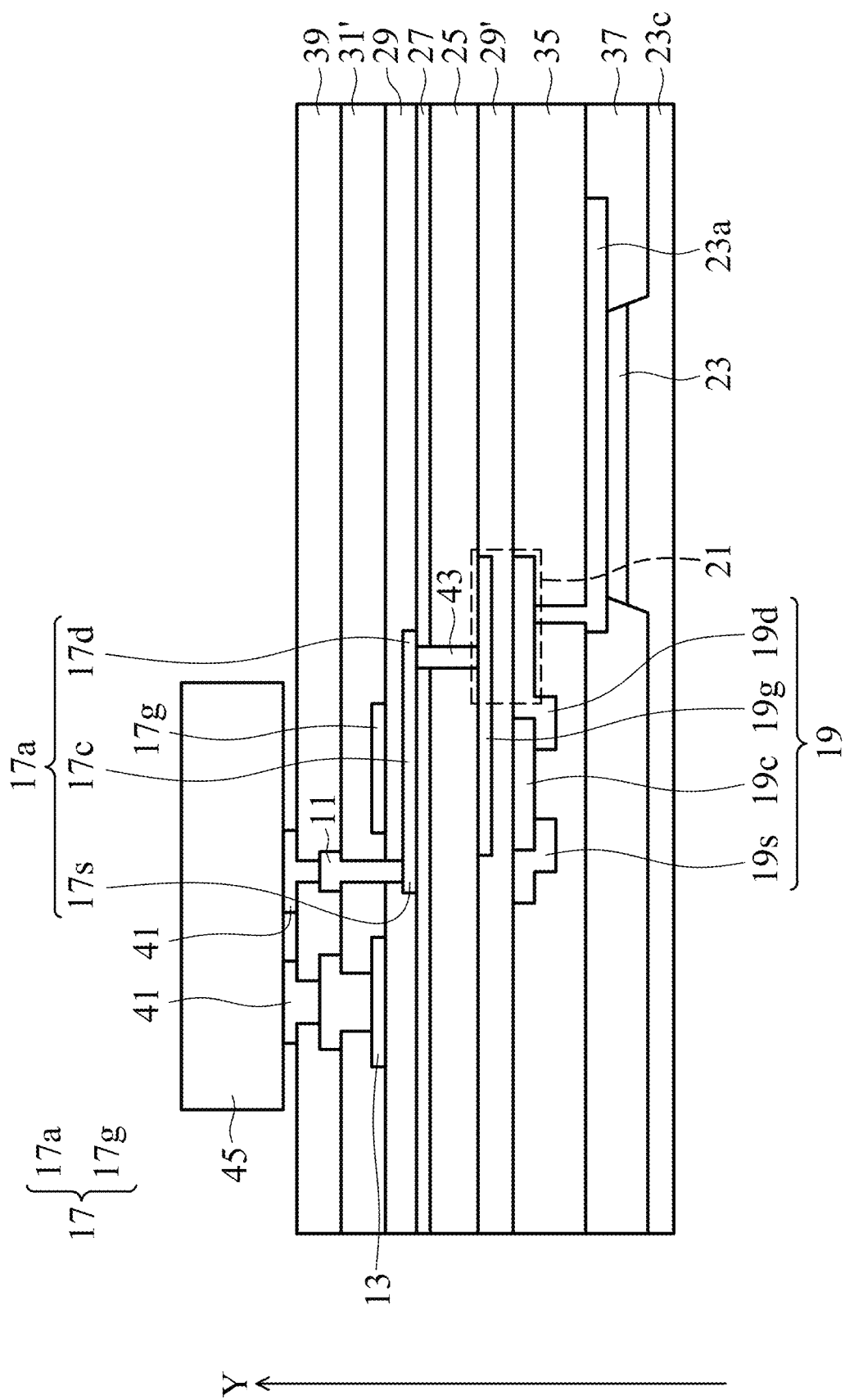

As shown in FIG. 3E, an external circuit 45 is then bonded to and electrically connected to the contacts 41. In one embodiment, the external circuit 45 can be a printed circuit board (PCB) or an integrated circuit (IC). In this embodiment, the external circuit 45 and the switching transistor 17 are disposed at the same side of the substrate 25, and the external circuit 45 and the driving transistor 19 (and the light-emitting element 23) are disposed at different sides of the substrate 25.

In another embodiment, the substrate includes at least a first film and a second film. In an embodiment, the first film and the second film can be in direct contact with each other. The switching transistor 17 can be formed on the first film, and the first film has a first through via (disposed in a conductive material) penetrates there through. In addition, a driving transistor 19 and a light-emitting element 23 can be formed on a second film, and the second film has a second through via (disposed in a conductive material) penetrates there through. In one embodiment, the first and second films can be polymer films. The first and second films are then attached, wherein the first through hole is aligned to the second through hole to form the structure shown in FIG. 3E. The benefit of the above processes is that the process yield of the switching transistor 17 and the process yield of the driving transistor 19 and the light-emitting element 23 will not interfere with each other.

Figure 4:
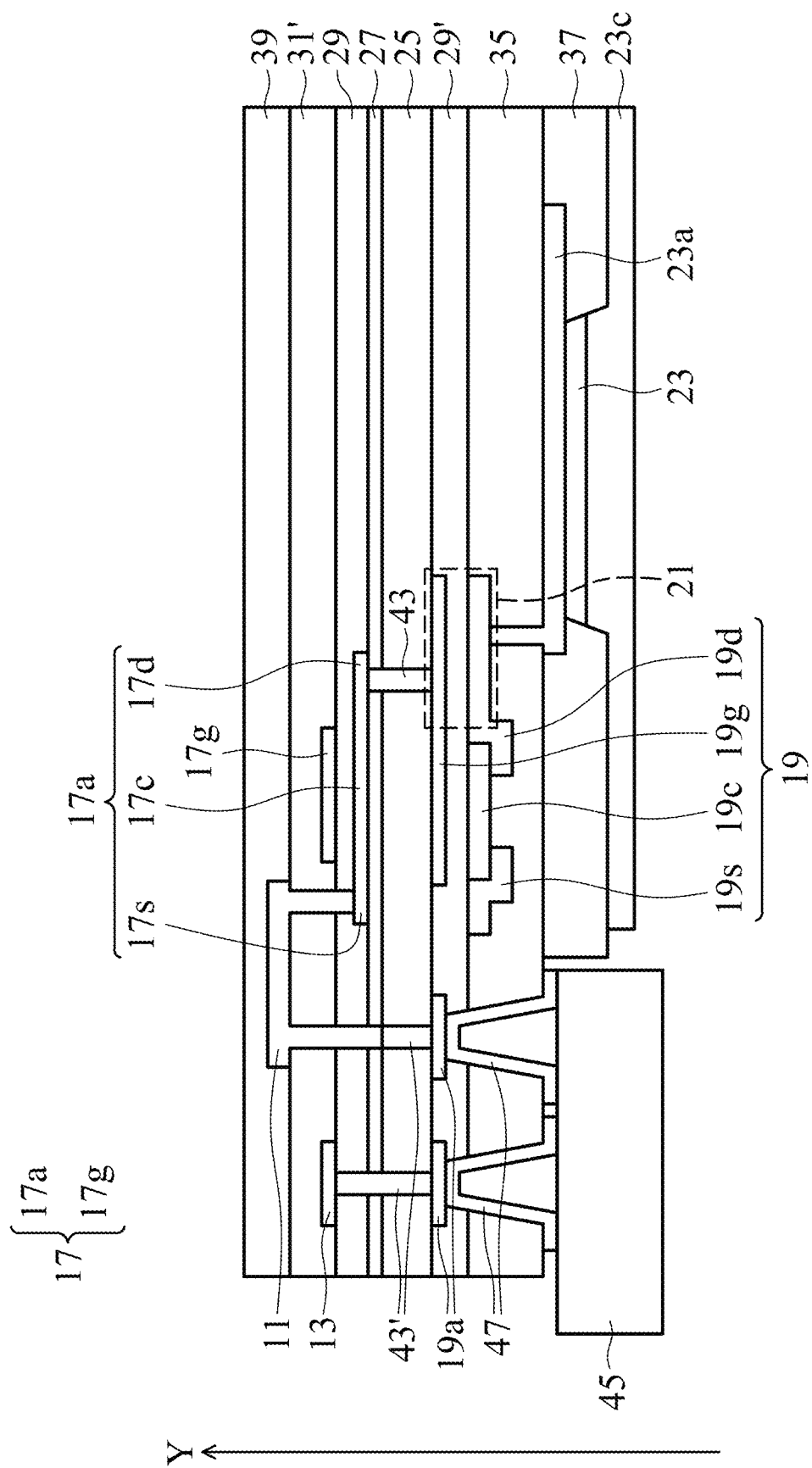
FIGS. 4 and 5 show partial cross-sectional views of display devices corresponding to the circuit diagram of FIG. 1 in embodiments of the disclosure.

FIG. 4 shows a partial cross-sectional view of a display device corresponding to the circuit diagram of FIG. 1 in one embodiment of the disclosure. As shown in FIG. 4, a buffer layer 27 is formed on a substrate 25. A semiconductor layer 17a is formed in a predetermined region for a switching transistor 17. The semiconductor layer 17a can be divided to a channel region 17c, and a source region 17s and a drain region 17d at two sides of the channel region 17c. A gate insulation layer 29 is then formed on the semiconductor layer 17a and the buffer layer 27. Subsequently, a scan line 13 and a gate electrode 17g is formed on the gate insulation layer 29, and the gate electrode 17g corresponds to the channel region 17c. A major structure of the switching transistor 17 is formed.

An insulation layer 31' is then formed on the gate electrode 17g, the scan line 13, and the gate insulation layer 29. A plurality of through vias are defined by lithography and etching to penetrate the gate insulation layer 29 and the insulation layer 31', and a conductor is then disposed in the through vias and layered on the insulation layer 31'. The conductor can be then patterned by lithography and etching to define a data line 11 connected to the source region 17s and the substrate 25 through the through vias. In FIG. 4, the gate electrode 17g contacts the scan line 13 through a through via. A protection layer 39 is then formed on the data line 11 and the gate insulation layer 31'.

A plurality of through vias 43 and 43' are formed to penetrate the substrate 25, the buffer layer 27, and the gate insulation layer 29, thereby exposing the drain region 17d, the drain region 17d through the through via and connects to the data line 11, and the scan line 13. A conductor is then disposed in the through vias and layered on the bottom surface of the substrate 25. The conductor can be then patterned by lithography and etching to define a gate electrode 19g and contacts 19a. A gate insulation layer 29' is then formed on the gate electrode 19g and the contacts 19a. A semiconductor layer 19c is then formed on the gate insulation layer 29' to correspond to the gate electrode 19g.

Subsequently, a source electrode 19s and a drain electrode 19d are formed on two respective sides of the semiconductor layer 19c, and a driving voltage line (not shown) is formed and connects to the source electrode 19s. An insulation layer 35 is then formed on the gate insulation layer 29', the source electrode 19s, the drain electrode 19d, and the semiconductor layer 19c. A major structure of the driving transistor 19 is completed. A storage capacitor 21 is built of the gate electrode 19g, the drain electrode 19d, and the gate insulation layer 29', the gate insulation layer 29' is disposed between the gate electrode 19g and the drain electrode 19d. A through via penetrating through the insulation layer 35 and openings penetrating through the insulation layer 35 and the gate insulation layer 29' are then formed by lithography and etching. A conductor is then disposed in the through via, and layered on sidewalls of the opening and the insulation layer 35. The conductor layer can be then patterned by lithography and etching to define an electrode 23a connecting to the drain electrode 19d through the through via, and contacts 47 on bottoms and sidewalls of the opening and a part of the insulation layer 35. The contacts 47 also contact the contacts 19a.

An insulation layer 37 is then formed on the electrode 23a and the insulation layer 35, and then patterned by lithography and etching to form an opening to expose a part of the electrode 23a. A light-emitting element 23 is then formed on the electrode 23a in the opening, and a common electrode 23c is formed on the light-emitting element 23. In addition, an external circuit 45 is then bonded to and electrically connected to the contacts 47.

In FIG. 4, the switching transistor 17 and the driving transistor 19 are respectively disposed on a top surface and a bottom surface of the substrate 25. The switching transistor 17 and the driving transistor 19 are overlapped in a direction Y that is vertical to the surface of the substrate 25, thereby reducing the transistor area. In this embodiment, the light-emitting element 23 is not overlapped with the switching transistor 17 or the driving transistor 19 in the direction Y, the direction Y is vertical to the surface of the substrate 25. Therefore, the display device can be a one-sided lighting device or a two-sided lighting device, which is determined by the layers being transparent or not (e.g. the thicknesses and the materials of the layers). FIG. 4 is different from FIG. 3E, in which the external circuit 45, the driving transistor 19, and the light-emitting element 23 are disposed at the same side of the substrate 25.

Figure 5:
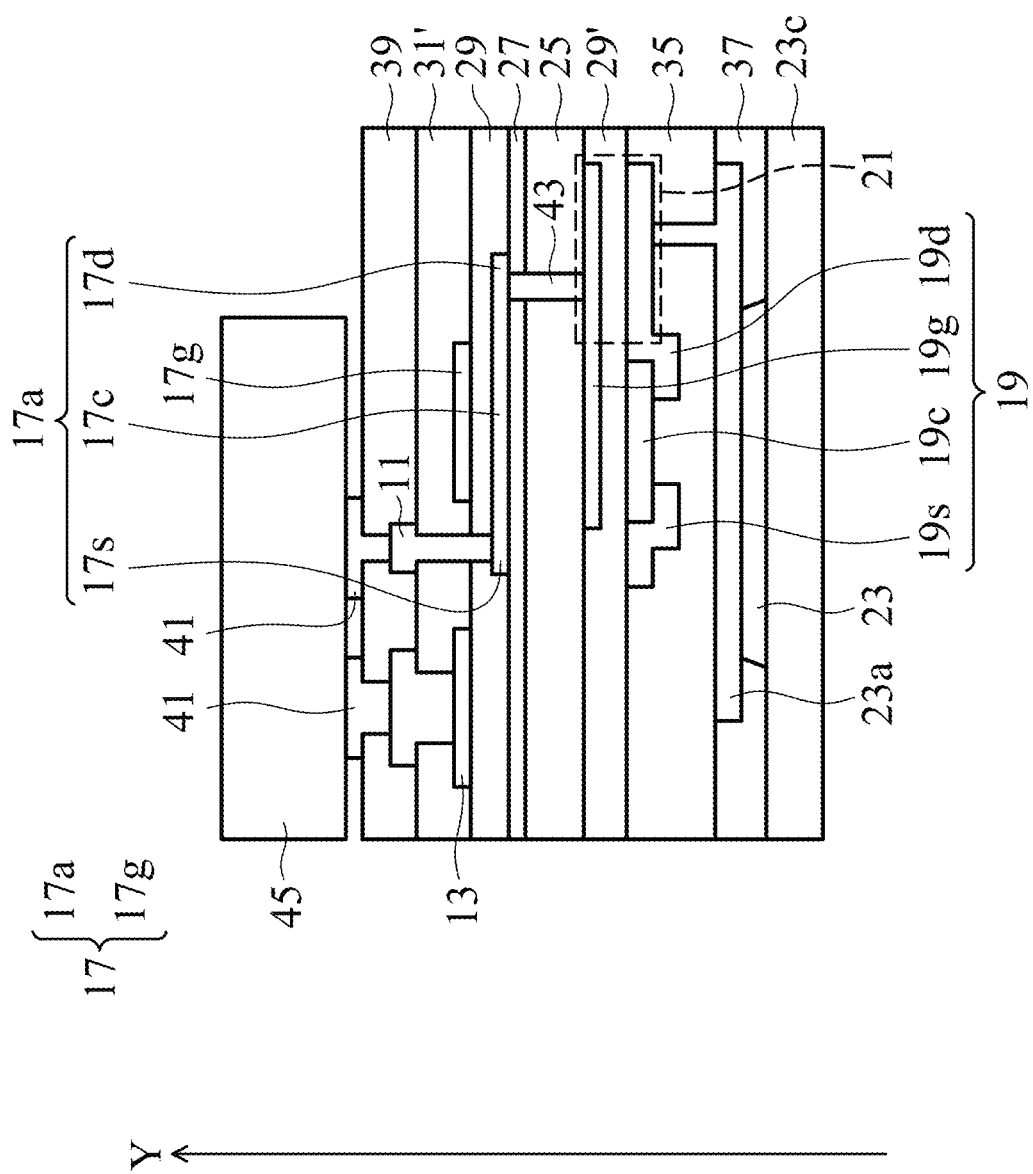

FIG. 5 is similar to FIG. 3E, and the difference in FIG. 5 is the light-emitting element 23 is overlapped with the switching transistor 17 and the driving transistor 19 in the direction Y, the direction Y is vertical to the surface of the substrate 25. Therefore, the pixel can be reduced further to enhance the image resolution. However, the light-emitting element 23 must be a one-sided (bottom sided) lighting element, and the common electrode 23c must be a transparent conductive material such as ITO.

Figure 6:
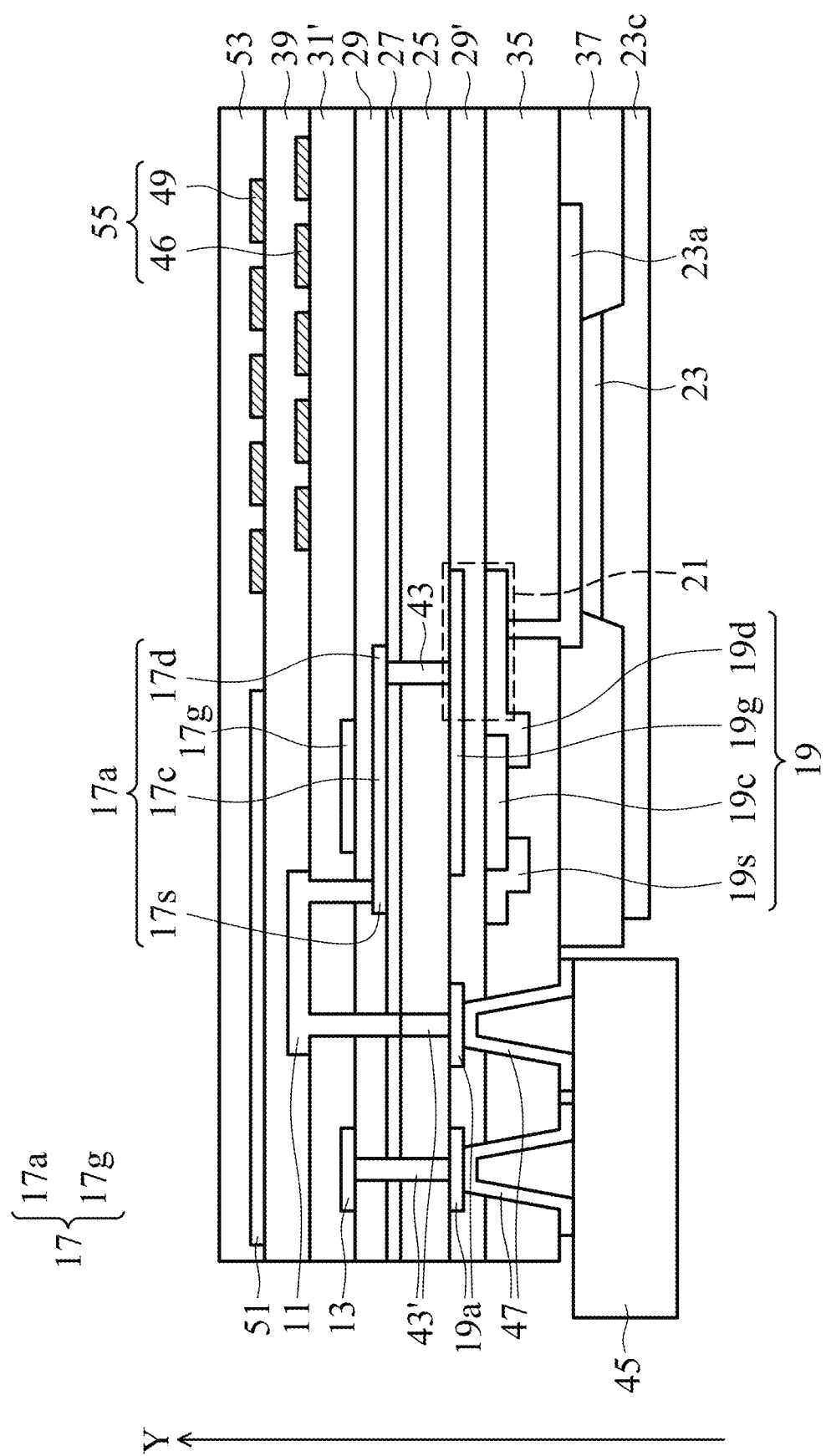
FIGS. 6 to 9 show partial cross-sectional views of touch sensing displays device in embodiments of the disclosure.

The display device can be integrated with a touch sensing element to form a touch sensing display device, as shown in FIG. 6. For example, touch sensing electrode layers 46 and 49 can be formed on top and bottom sides of the protection layer 39 to correspond to the light-emitting element 23, thereby defining the touch sensing element 55. In this embodiment, the display device is a one-sided (top sided) display device. A light shielding layer 51 can be formed on the protection layer to correspond to the transistor out of the light-emitting element 23 and the external circuit 45, and ambient light reflected can be prevented by the metal of the transistors. A protection layer 53 can be formed on the light shielding layer 51, the touch sensing electrode 49, and the protection layer 39. In one embodiment, the protection layer 53 can be composed of organic or inorganic insulation material. When the protection layer 53 is a cover glass (not shown), it may further include an adhesive, which is attached to the cover glass. In another embodiment, a single-layered touch sensing electrode layer is utilized, which can be disposed on the top surface or the bottom surface of the protection layer 39.

Figure 7:
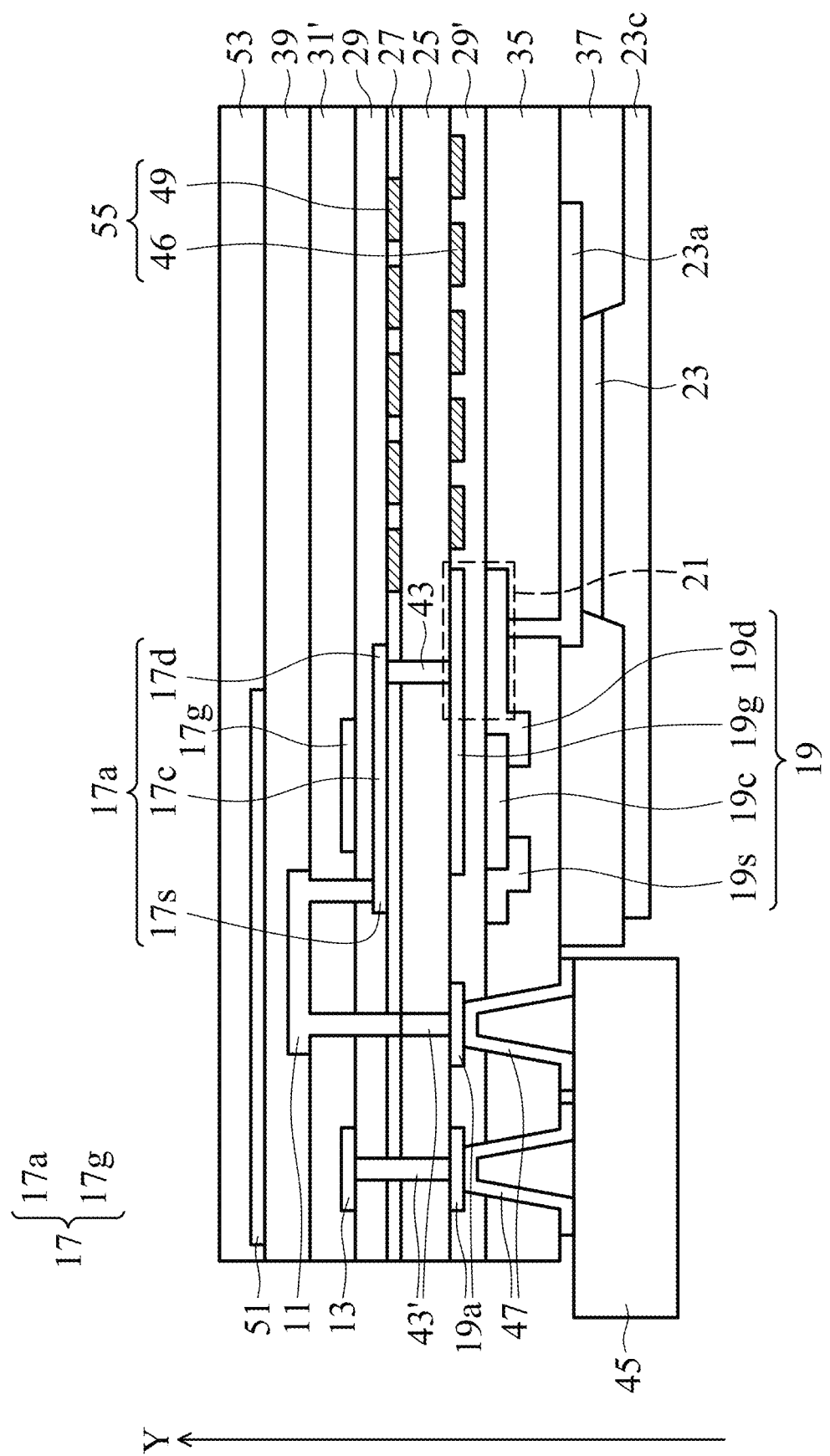

FIG. 7 is similar to FIG. 6, and the difference in FIG. 7 is the touch sensing electrode layers 46 and 49 being disposed on two respective sides of the substrate 25. In general, the touch sensing electrode layers 46 and 49 are formed on the top surface and the bottom surface of the substrate 25 to define a touch sensing element 55. A buffer layer 27 and the other layers are then formed. In one embodiment, the through vias 43 and 43' can be formed before or after the formation of the touch sensing electrode layers 46 and 49, and the subsequent processes are then performed. In other embodiments, a single-layered sensing electrode layer can be utilized, which can be disposed on a top surface or a bottom surface of the substrate 25. The display device is a one-sided (top-sided) display device.

Figure 8:
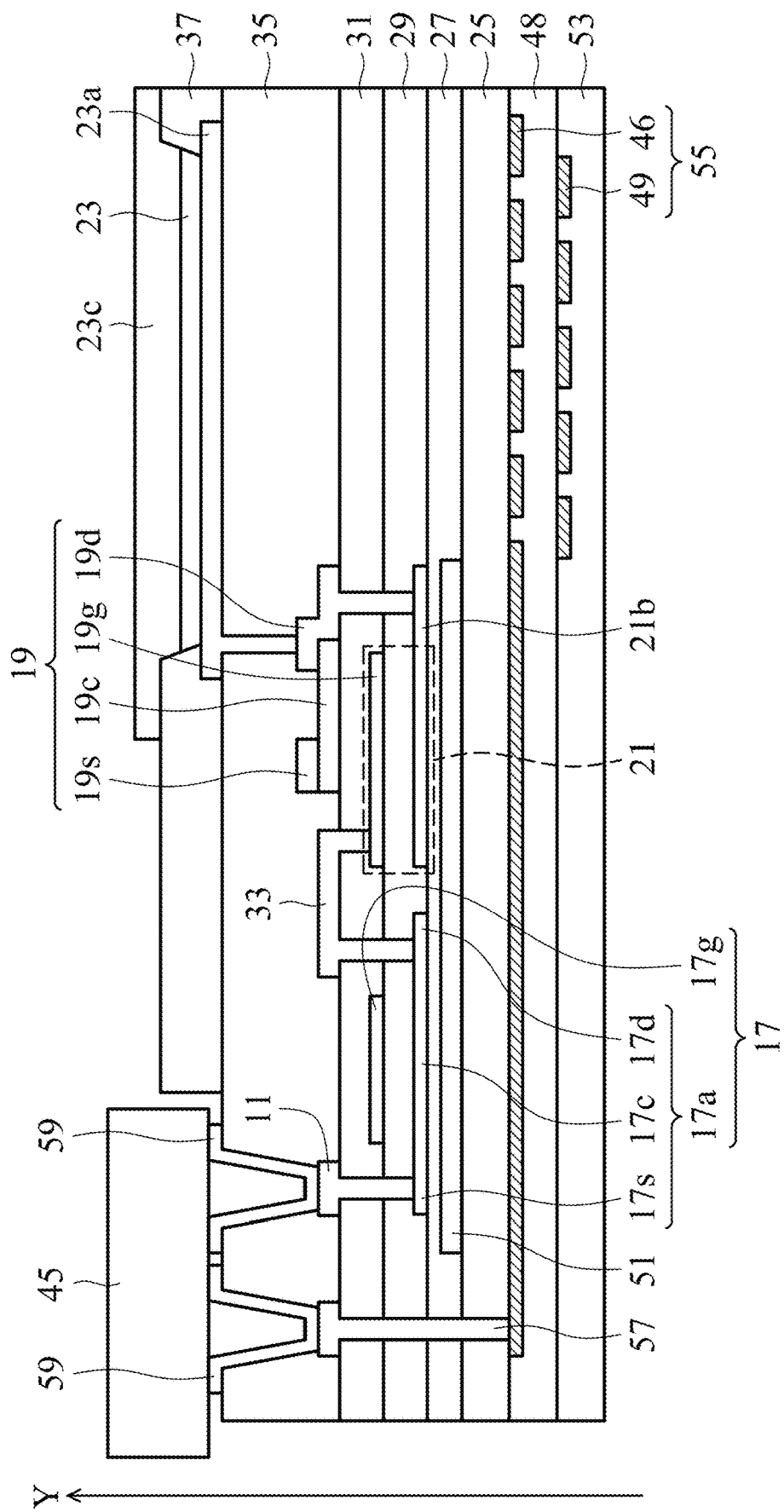

The display device can be integrated with a touch sensing element to form a touch sensing display device, as shown in FIG. 8. For example, the position of the light-emitting element 23 in FIG. 2 can be changed, and it does not overlap with the switching transistor 17 and the driving transistor 19 in the direction that is vertical to the surface of the substrate 25. In addition, the light shielding layer 51 is formed on the substrate 25 before the formation of the buffer layer 27, and the light shielding layer 51 corresponds to the switching transistor 17 and the driving transistor 19 formed in following processes. A through via 57 is formed to penetrate through the gate insulation layer 31, the gate insulation layer 29, the buffer layer 27, and the substrate 25. The insulation layer 35 corresponding to the through via 57 and the data line 11 is not covered by the insulation layer 37. Openings are formed to expose the through via 57 and the data line 11, and the step of forming the electrode 23a also forms a conductor covering bottoms and sidewalls of the openings to define contacts 59. An external circuit 45 is bonded to and electrically connected to the contacts 59. The touch sensing electrode layer 46 is disposed on the bottom surface of the substrate 25, and electrically connected to the external circuit 45 through the through via 57 and the contact 59. An insulation layer 48 is disposed on the touch sensing electrode layer 46 and the bottom surface of the substrate 25. A touch sensing electrode layer 49 is disposed on the insulation layer 48, and a protection layer 53 is disposed on the touch sensing electrode layer 49 and the insulation layer 48. In one embodiment, the insulation layer 48 can be composed of inorganic or organic material. In one embodiment, the protection layer 53 can be composed of an organic or insulation layer. When the protection layer 53 is a cover glass (not shown), it may include an adhesive, which is attached to the cover glass. The touch sensing electrode layer 46, the touch sensing electrode layer 49, and the insulation layer 48 disposed between the touch sensing electrode layer 46 and the touch sensing electrode layer 49, they are combined into the touch sensing element 55. In another embodiment, a single-layered touch sensing electrode layer can be utilized, which can be disposed on the top surface or the bottom surface of the insulation layer 48. The above display device is a one-sided (bottom sided) display device.

Figure 9:
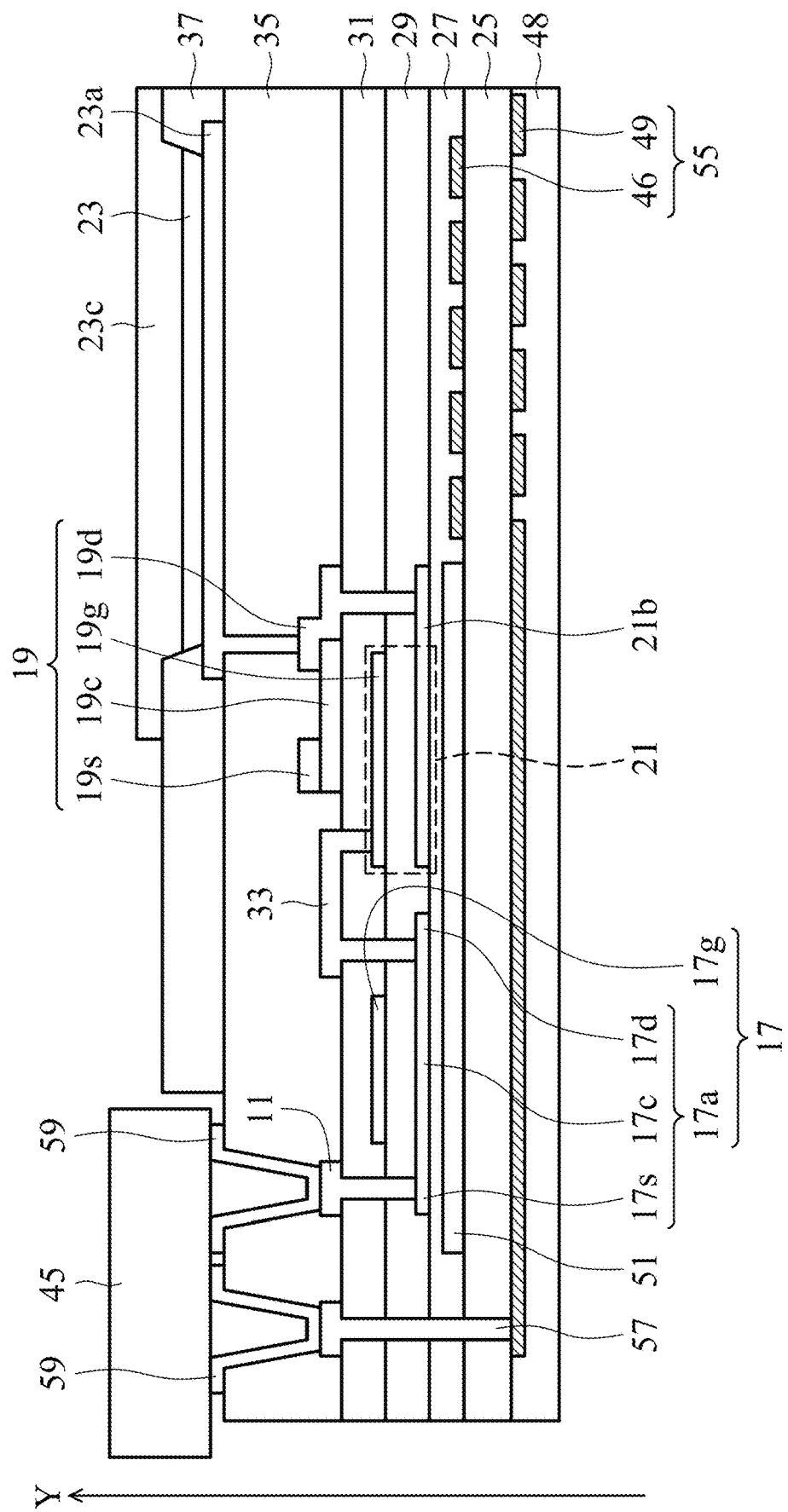

FIG. 9 is similar to FIG. 8, and the difference in FIG. 9 is the touch sensing electrode layers 46 and 49 being disposed on two respective sides of the substrate 25. In another embodiment, a single-layered touch sensing electrode layer can be utilized, which can be disposed on a top surface or a bottom surface of the substrate 25. The display device is a one-sided (bottom-sided) display device.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An array substrate structure, comprising:
a substrate;
a first transistor disposed on the substrate, comprising a first semiconductor layer having a drain region;
a second transistor disposed on the substrate, comprising a gate electrode;
a second semiconductor layer disposed under the gate electrode;
an electrode directly connected to the second semiconductor layer; and
a light-emitting element electrically connected to the second semiconductor layer through the electrode;
wherein the drain region of the first semiconductor layer is electrically connected to the gate electrode of the second transistor;
wherein the gate electrode of the second transistor is a part of a storage capacitor.

2. The array substrate structure as claimed in claim 1, wherein the first transistor and the second transistor are disposed on a same side of the substrate.

3. The array substrate structure as claimed in claim 1, further comprising a bridging line connecting the drain region and the gate electrode.

4. The array substrate structure as claimed in claim 1, further comprising another electrode and a common electrode, wherein the light-emitting element is disposed between the another electrode and the common electrode.

* * * * *